United States Patent
Kim (10) Patent No.: US 7,584,407 B2
(45) Date of Patent: Sep. 1, 2009

(54) DECODER AND METHOD FOR PERFORMING DECODING OPERATION USING MAP ALGORITHM IN MOBILE COMMUNICATION SYSTEM

(75) Inventor: Seok-Chan Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 589 days.

(21) Appl. No.: 11/038,122

(22) Filed: Jan. 21, 2005

(65) Prior Publication Data

US 2005/0172203 A1    Aug. 4, 2005

(30) Foreign Application Priority Data

Jan. 20, 2004    (KR) ................. 10-2004-0004400

(51) Int. Cl.
*H03M 13/03* (2006.01)

(52) U.S. Cl. .................. 714/794; 714/795; 714/796; 375/262; 375/341

(58) Field of Classification Search ............... 714/755, 714/794–796; 375/341, 262
See application file for complete search history.

(56) References Cited

U.S. PATENT DOCUMENTS

| | | | | |
|---|---|---|---|---|
| 6,754,290 B1 * | 6/2004 | Halter | ............ | 375/340 |
| 6,829,313 B1 * | 12/2004 | Xu | ............ | 375/341 |
| 6,901,117 B1 * | 5/2005 | Classon et al. | ............ | 375/341 |
| 2002/0174401 A1 * | 11/2002 | Wang et al. | ............ | 714/786 |
| 2004/0039769 A1 * | 2/2004 | Orio | ............ | 708/530 |

* cited by examiner

*Primary Examiner*—Esaw T Abraham
(74) *Attorney, Agent, or Firm*—Roylance, Abrams, Berdo & Goodman, L.L.P.

(57) ABSTRACT

A turbo decoder and a decoding method are disclosed, which use a Maximum A Posteriori (MAP) algorithm in order to perform iterative decoding. The method has the steps of sequentially receiving input data in a memory having a predetermined window size and performing a forward metric calculation for the input data so that the input data has a four window size, performing a first backward metric calculation for the input data and outputting first valid data when the data are input to the memory by twice the window size, and performing a second backward metric calculation for the input data and outputting second valid data when the data are input to the memory by three times the window size.

13 Claims, 7 Drawing Sheets

DECODER AND METHOD FOR PERFORMING DECODING OPERATION USING MAP ALGORITHM IN MOBILE COMMUNICATION SYSTEM

PRIORITY

This application claims to the benefit under 35 U.S.C. §119(a) of an application entitled "Decoder and Method for Performing Decoding Operation Using MAP Algorithm in Mobile Communication System" filed in the Korean Intellectual Property Office on Jan. 20, 2004 and assigned Serial No. 2004-4400, the entire contents of which are incorporated herein by reference.

BACKGROUND OF THE INVENTION

1. Field of the Invention

The present invention relates to a decoding apparatus and a decoding method of a mobile communication system. More particularly, the present invention relates to a turbo decoder and a decoding method, which use a Maximum A Posteriori (MAP) algorithm in order to perform iterative decoding.

2. Description of the Related Art

In general, in order to correct an error of a channel transmitted through wireless environments, a wireless mobile communication system uses a channel estimation method by which a transmitter performs a coding operation using an error correction code and a receiver corrects the error for the received channel.

A correctable coding scheme for performing such an error correction includes a method using a convolutional code and a method using a turbo code. In the embodiments of the present invention, a method for correcting an error using a turbo code will be described. The conventional turbo code is employed when channels of a high data rate are coded or decoded in a CDMA 2000 used in USA and a W-CDMA used in Europe. This turbo code is subjected to iterative decoding even in low reception power, so that the turbo code has a value approximate to the Shannon Limit, which is a theoretical limit. In particular, the turbo code is usually used when a high speed image signal service and a data service are provided.

A decoding method of the conventional turbo code includes a Soft-Output Viterbi Algorithm (SOVA) scheme and an MAP scheme. A receiver performs iterative decoding operation by means of the decoding schemes and thus restores the original information transmitted from a transmitter. In general, when a decoding operation is performed by means of the SOVA, a decoder separately requires predetermined bits in consideration of a dynamic range increased by the Branch Metric Calculation (BMC).

Further, when a decoding operation is performed by means of the MAP, a decoder further requires predetermined bits because the internal BMC is determined by a code rate. However, a decoder using the SOVA has a reduced Bit Error Rate (BER) performance as compared with a decoder using the MAP.

For example, as compared with the SOVA scheme, an MAP scheme has a higher coding gain by about 0.3 dB in Additive White Gaussian Noise environments having good channel conditions and by about 3 dB in Rayleigh Fading environments having bad channel conditions.

Figure 1:
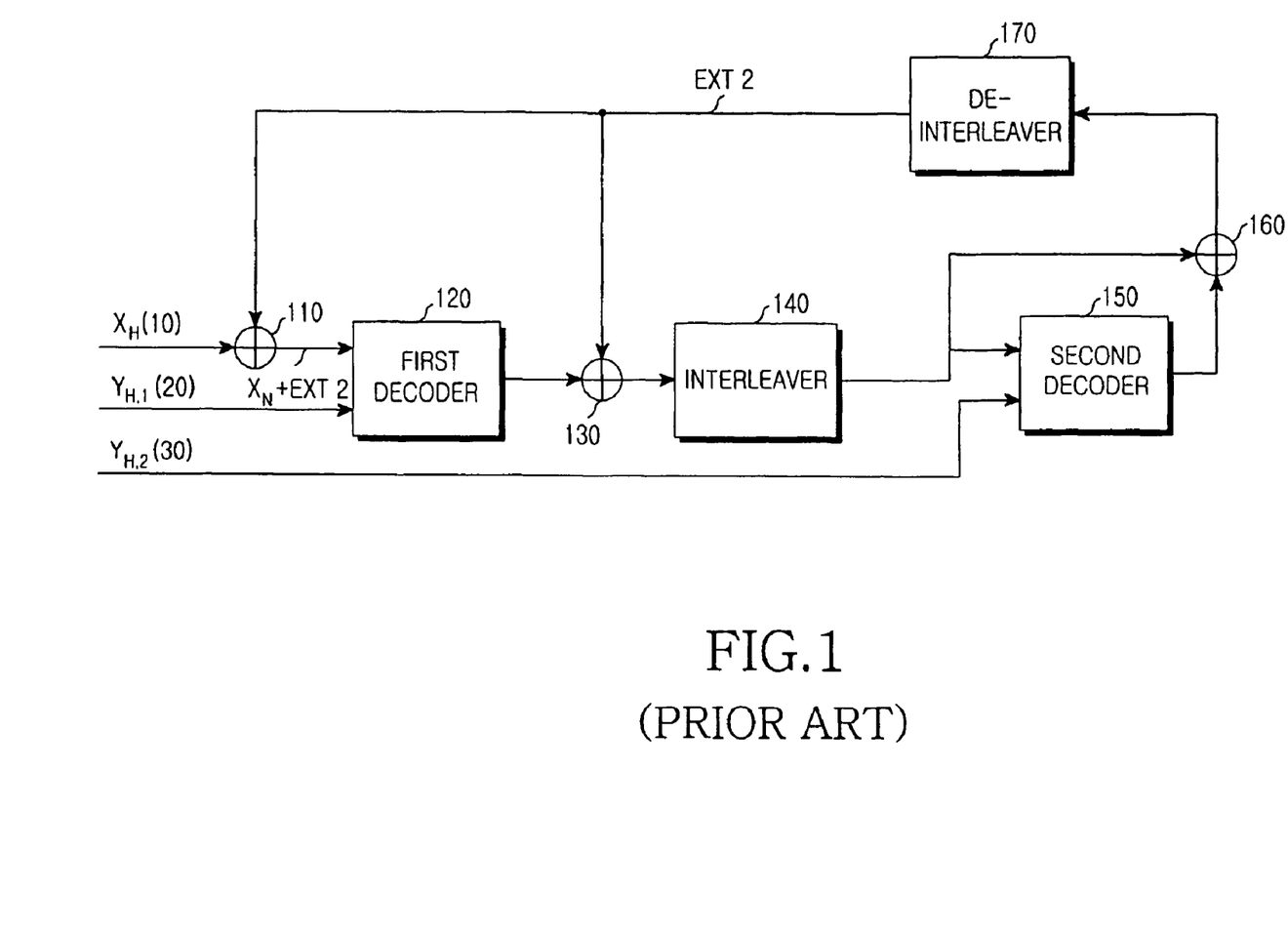
FIG. 1 is a block diagram schematically showing the structure of a conventional turbo decoder.

FIG. 1 is a block diagram schematically showing the structure of a general turbo decoder.

Referring to FIG. 1, the conventional turbo decoder of a transmitter divides the data to be transmitted into a systematic bit X, a first parity bit y1 and a second parity bit y2 and outputs the systematic bit X, the first parity bit y1 and the second parity bit y2. Then, a turbo decoder of a receiver receives the systematic bit X, the first parity bit y1 and the second parity bit y2 and decodes the received bits by means of two decoders 120 and 150, an interleaver 140 and a deinterleaver 170. First, the first decoder 120 decodes the forward input data x and y1 and the second decoder 150 decodes the randomly input data x and y1. The forward input data x is summed with the output from the deinterleaver 170 by adder 110. Accordingly, the interleaver 140 is disposed before the second decoder 150 and interleaves the input data x, which is again summed with the output of deinterleaver 170 by adder 130 and y1. Then, the second decoder 150 decodes the interleaved data. The first decoder 120 and the second decoder 150 inputs a soft signal value of a bit group including plural bits, which is similar to a frame, and outputs a decoded soft signal value. Further, the deinterleaver 170 aligns the data, which have been interleaved by the interleaver 140, according to an input sequence, which is the sum of the output from the second decoder 150 and the interleaver 140, from adder 160. Herein, the decoder may be used as a Recursive Systematic Convolutional (RSC) encoder. In relation to the decoders 120 and 150 of FIG. 1, a decoder using an MAP scheme is shown in FIG. 2.

Figure 2:
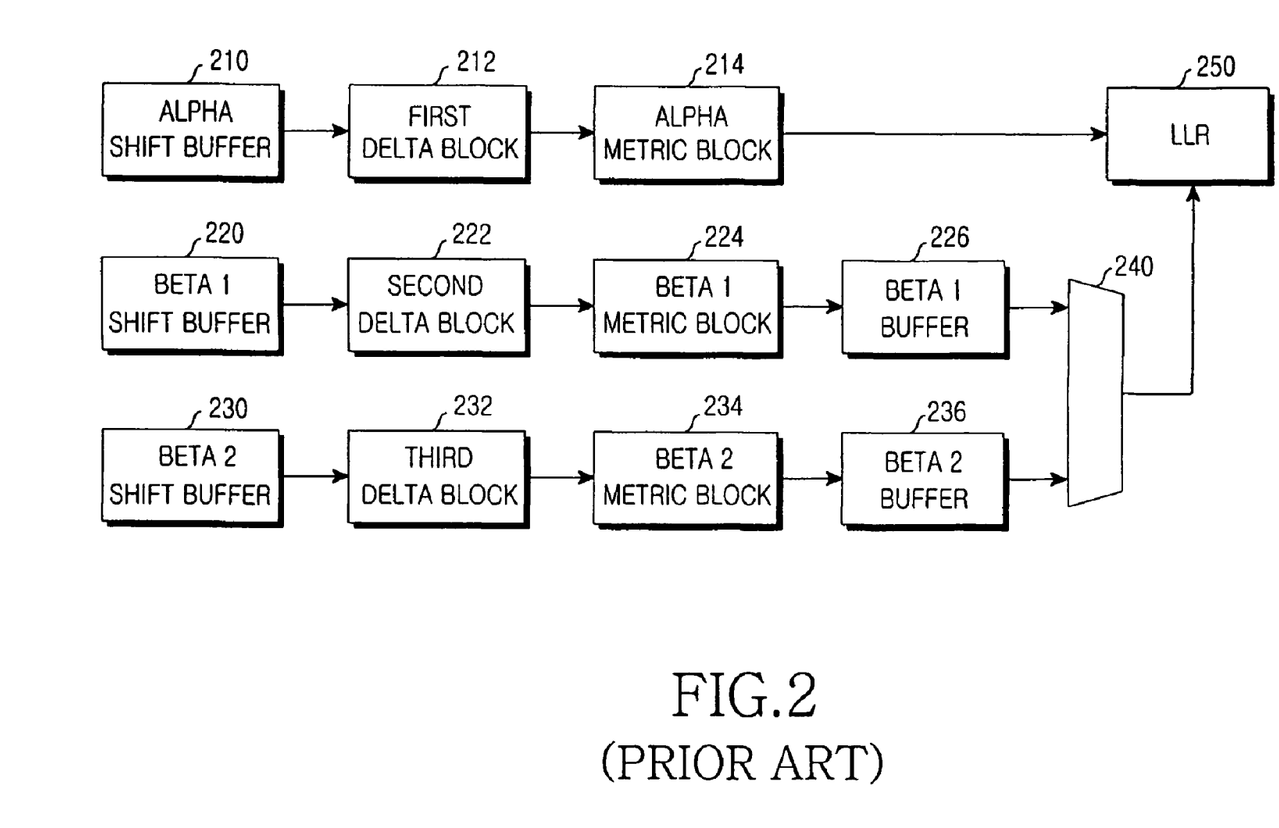
FIG. 2 is a block diagram schematically showing the structure of a conventional decoder using an MAP scheme.

FIG. 2 is a block diagram schematically showing the structure of a conventional decoder using the MAP scheme.

Referring to FIG. 2, an alpha shift buffer 210 receives data input by the frame unit and transfers the received data to an alpha metric block 214 through a first delta block 212. Herein, the alpha shift buffer 210 transfers the input data so that the data is calculated in the forward direction. The alpha metric block 214 performs a calculation for the forward input data of four windows each time.

Further, a beta 1 shift buffer 220 outputs data corresponding to the size of two windows in accordance with the output having a four window size of the alpha shift buffer 210. Herein, the data output through the beta 1 shift buffer 220 is transmitted to a beta 1 metric block 224 through a second delta block 222. The beta 1 metric block 224 performs a backward metric calculation for the input data and the calculated data is stored in a beta 1 buffer 226.

Further, a beta 2 shift buffer 230 outputs data corresponding to the size of two windows. Herein, in contrast with the beta 1 shift buffer 220, the beta 2 shift buffer 230 delays data of one window size and outputs undelayed data. The data output through the beta 2 shift buffer 230 is transmitted to a beta 2 metric block 234 through a third delta block 232. Herein, the beta 2 metric block 234 delays information of the first input window and performs a backward metric calculation for the input data. Further, the calculated data is stored in a beta 2 buffer 236.

A multiplexer 240 receives the beta metric calculation values output through the beta 1 metric block 224 from the beta 1 buffer 226 and the beta 2 metric block 234 from the beta 2 buffer 236, and selectively outputs only valid values. That is, the multiplexer 240 selects a block, which actually outputs valid beta metric calculation values, and transmits data to a Log-Likelihood Ratio (LLR) generation circuit 250. The LLR generation circuit 250 receives output values corresponding to four window sizes output through the alpha shift buffer 210 and the valid beta metric calculation values, and restores the originally transmitted data.

Figure 3:
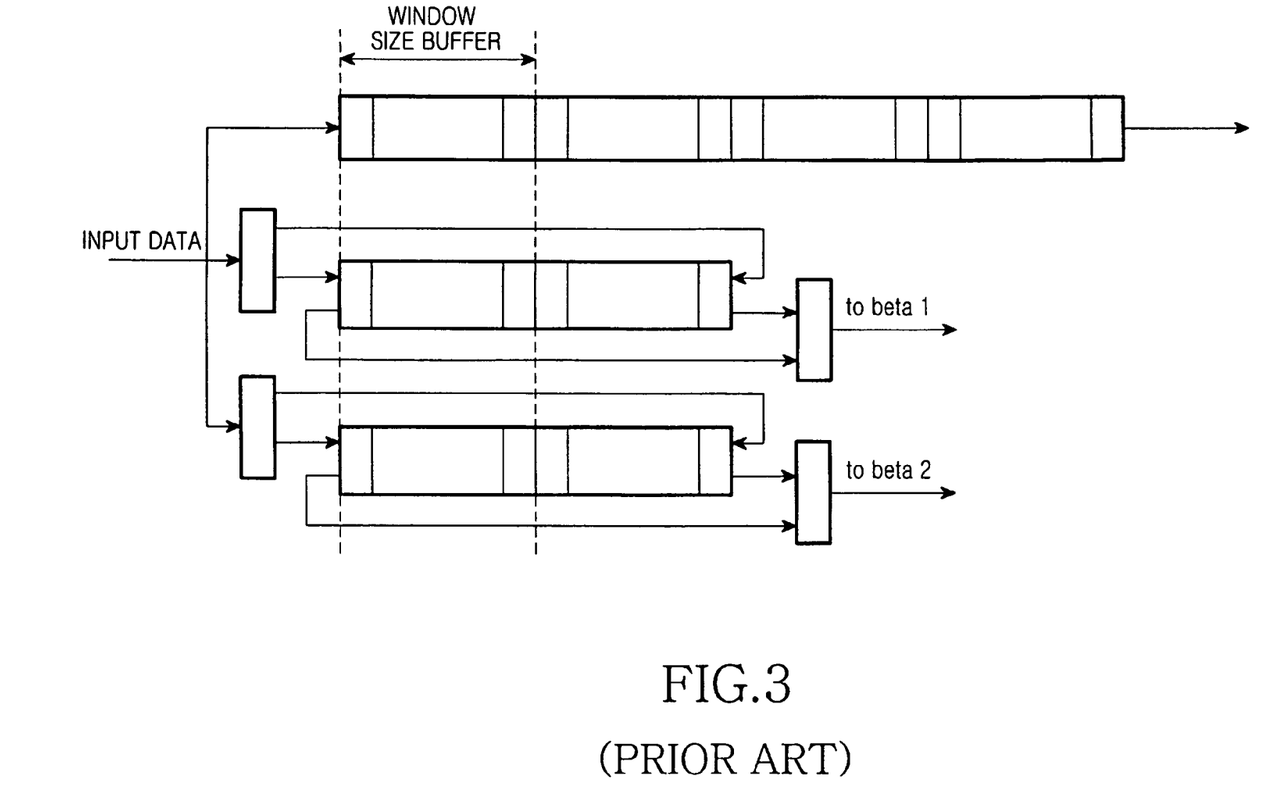
FIG. 3 is a diagram illustrating a decoding process for processing input data in a conventional decoder according to an MAP scheme.

FIG. 3 is a diagram illustrating the operations of buffers corresponding to input data in a decoder using a conventional MAP scheme.

Referring to FIG. 3, the decoder uses plural buffers (such as memories) for storing the input data according to window size W blocks and constructs a system. First, since the decoder performs an alpha metric calculation, it requires four memories corresponding to window size W. Further, since the decoder performs a beta metric calculation, it requires two memories corresponding to window size W. That is, in order to perform one decoding operation, the decoder requires at least eight memories corresponding to window size W. Therefore, design of the memory may result in inefficiencies of design.

In relation to the buffers of FIG. 3, a process for calculating an LLR by performing a metric calculation for the data output from each buffer will be described with reference to FIG. 4.

Figure 4:
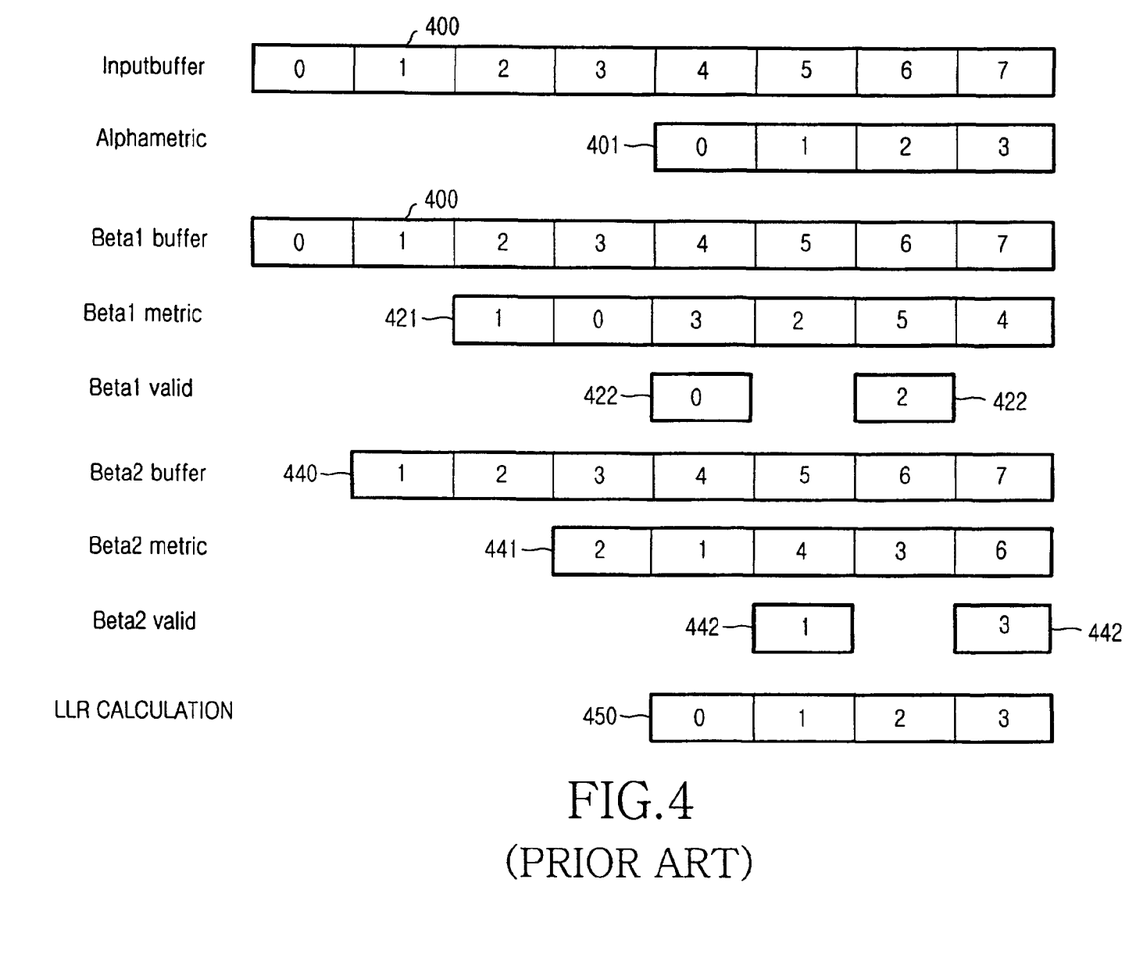
FIG. 4 is a diagram illustrating a result obtained by processing input data according to time in a conventional decoder using an MAP scheme.

FIG. 4 is a diagram illustrating a conventional process for processing data according to a BMC for input data.

Referring to FIG. 4, the codewords of eight bits output from the alpha shift buffer 210 are output to the alpha metric block 214 through the first delta block 212. Herein, since the alpha metric block 214 uses a buffer having four window size W blocks, the alpha metric 214 sequentially outputs codeword data of four bits. For example, data (0, 1, 2, 3) and (4, 5, 6, 7) is sequentially input to the alpha shift buffer 210 (400). The input data is sequentially output by the four windows (0, 1, 2, 3) of the data through a calculation process in the alpha metric block 214 (401).

Herein, when a path metric of two bits is performed by the first delta block 212, the beta 1 shift buffer 220 outputs stored data in accordance with the operation of the alpha shift buffer 210 of eight bits. That is, the beta 1 metric block 224 starts to receive data of two window size W blocks in the backward direction in accordance with four memories for metric states of eight bits output from the alpha shift buffer 210. Herein, when data is stored in the alpha metric block 214 by the size of two buffers, the first data of the beta 1 shift buffer 220 is output. The beta 1 metric block 224 receives the data in a backward direction.

For example, the beta 1 shift buffer 220 outputs (421) data of two window size in the backward direction in accordance with (400) the sequentially input data. That is, the input data (0, 1, 2, 3) and (4, 5, 6, 7) is input in a sequence of (1, 0), (3, 2) and (5, 4) through a calculation process in the beta 1 metric block 224 (421). Herein, the beta 1 metric block 224 outputs valid values 0 and 2 of the calculated values to the beta 1 buffer 226 (422).

Further, the beta 2 metric block 234 delays the first window of the input data and outputs data of two window size in the backward direction. That is, the beta 2 metric block 234 delays the first data in accordance with four memories for metric states of eight bits output from the alpha shift buffer 210, and then starts to receive data of two window size W blocks in a backward direction.

For example, the beta 2 shift buffer 230 delays data of one window size in accordance with the sequentially input data (440) and then outputs undelayed data of two window size in the backward direction (441). That is, the input data (1, 2, 3) and (4, 5, 6, 7) is input in a sequence of (2, 1) and (4, 3) and 6 through a calculation process in the beta 2 metric block 234 (441). Herein, the beta 2 metric block 234 outputs valid values 1 and 3 of the calculated values to the beta 2 buffer 236 (442).

The valid values stored in the beta 1 buffer 226 and the beta 2 buffer 236 are selectively output to the LLR generation circuit 250 by the multiplexer 240 in accordance with a value output from the alpha metric block 214.

This results from the MAP coding process of the turbo code. That is, the channel input of the decoder and an LLR value output from another decoder are input and subjected to the BMC and an Add-Compare Select (ACS), thereby generating an LLR value.

As described above, a forward metric calculation and a backward metric calculation are performed in order to perform the MAP algorithm. Further, the alpha metric calculation is performed in the forward direction and the beta metric calculation is performed in the backward direction under the alpha metric calculation.

Such a decoding process is repeated so as to generate an LLR value having high reliability and iterative decoding is performed by a maximum iteration value, so that a Cyclic Redundancy Check (CRC) is performed. Therefore, a hard decision is finally obtained.

However, the MAP decoding process as described above has the following problems.

First, since the backward metric calculation is performed, additional memories are necessary for storing the input data. The memory includes the beta 1 shift buffer 220 and the beta 2 shift buffer 230 according to the backward metric calculation. Herein, it is necessary to provide each calculation block with separate control logics for controlling the memories, that is, the alpha shift buffer 210, the beta 1 shift buffer 220 and the beta 2 shift buffer 230.

Second, the backward metric calculation starts at the last portion of a frame and is updated at each trellis transition. That is, the backward metric calculation always experiences an update process. Therefore, delays occur due to the data update.

SUMMARY OF THE INVENTION

Accordingly, the present invention has been made to solve the above-mentioned problems occurring in the prior art, and it is an object of the present invention to provide a turbo decoder and a decoding method, which use an MAP algorithm in order to perform iterative decoding in a mobile communication system.

It is another object of the present invention to provide a turbo decoder and a decoding method, which perform iterative decoding using one input memory.

It is further another object of the present invention to provide a turbo decoder and a decoding method, which perform a forward decoding or a backward decoding by means of one input memory.

In accordance with one aspect of the present invention, there is provided a method for performing iterative decoding by a decoder in a mobile communication system using a turbo code, the method comprising the steps of a) performing a forward metric calculation for sequentially input data by means of one memory corresponding in size to four windows; b) performing a first backward metric calculation for the input data the moment the forward metric calculation is performed for the input data by a size of three times the window; and c) performing a second backward metric calculation for the input data the moment the forward metric calculation is performed for the input data by a size of four times the window.

In accordance with one aspect of the present invention, there is provided a decoding apparatus for performing iterative decoding in a mobile communication system using a turbo code, the decoding apparatus comprising: one memory for outputting input data corresponding in size to four windows in the forward direction or a backward direction; an alpha metric block for performing a forward metric calculation for sequentially input data so that the data corresponds in size to four windows; a first metric block for performing a first backward metric calculation for the input data the moment a forward calculation is performed for the input data by a size of three times the window; and a second metric block for performing a second backward metric calculation for the input data the moment a forward calculation is performed for the input data by a size of four times the window.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, the preferred embodiments according to the present invention will be described with reference to the accompanying drawings. In the following description of the embodiments of the present invention, a detailed description of known functions and configuration incorporated herein will be omitted for the sake of conciseness. Terms are defined on the basis of the entire contents of the present specification.

The embodiments of the present invention provide a method for performing a decoding through minimum memories by means of an MAP algorithm and a multi-sliding window scheme in an apparatus comprising a turbo decoder.

Further, embodiments of the present invention comprise one input memory, a forward metric block or a backward metric block for performing an LLR, and one calculation buffer for storing valid values of a backward metric calculation. Herein, the input memory preferably has a First-in First-Out (FIFO) structure and performs iterative decoding.

Figure 5:
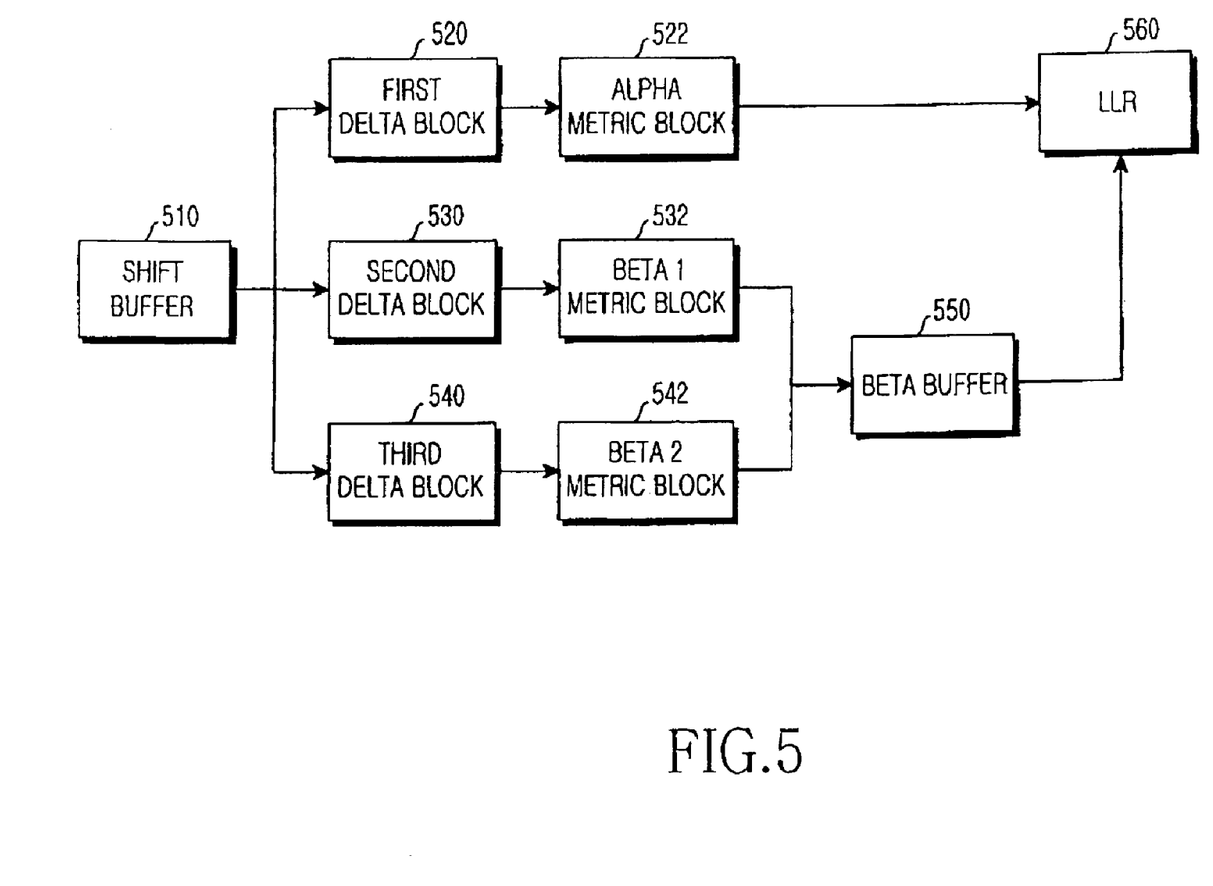
FIG. 5 is a block diagram showing the structure of a decoder using an MAP scheme according to an embodiment of the present invention.

FIG. 5 is a block diagram of a decoder using an MAP scheme according to an embodiment of the present invention.

Referring to FIG. 5, a shift buffer 510 receives data input by the frame and outputs the received data to a first delta block 520, a second delta block 530 and a third delta block 540. Herein, an alpha metric block 522 receives the sequentially input data and performs a calculation for the received data according to fours window. The windows are preferably of a predetermined size, and further are preferably of uniform size.

In contrast, a beta 1 metric block 532 receives the sequentially input data, performs a backward metric calculation having preferably only two times the window sizes for the received data, and outputs the calculated data.

Further, a beta 2 metric block 542 receives the sequentially input data, delays data of one window, performs a backward metric calculation having two windows for the undelayed data, and outputs the calculated data. Herein, the beta 1 metric block 532 and the beta 2 metric block 542 receive beta metric calculation values respectively and alternate storing the received values in a beta buffer 550.

In other words, when input data is stored in the shift buffer 510 and is calculated by two windows, the beta 1 metric block 532 starts a backward calculation. Further, when the input data is stored in the shift buffer 510 and is calculated by two windows, the beta 2 metric block 542 delays data of one window and starts a backward calculation. Herein, the beta 1 metric block 532 and the beta 2 metric block 542 start to output valid beta metric calculation values to the beta buffer 550 after ending the calculations. This means that the two beta metric calculation circuits 532 and 542 alternately repeat a path merging operation and a valid beta value generation operation. When the fourth window is completely filled with data and then data comes into the first window again, a forward metric calculation is performed. Further, when windows are completely filled with data and then data comes into the first window again on the basis of a beta metric, a forward metric calculation is performed. Herein, beta metric values in each window block are output in the backward direction because the beta metric values have been generated on the basis of the beta metric. Accordingly, it is necessary to change the output direction of the beta metric values to a forward direction. In order to output data in the backward direction and the data in the forward direction, an FIFO circuit is used.

Figure 6:
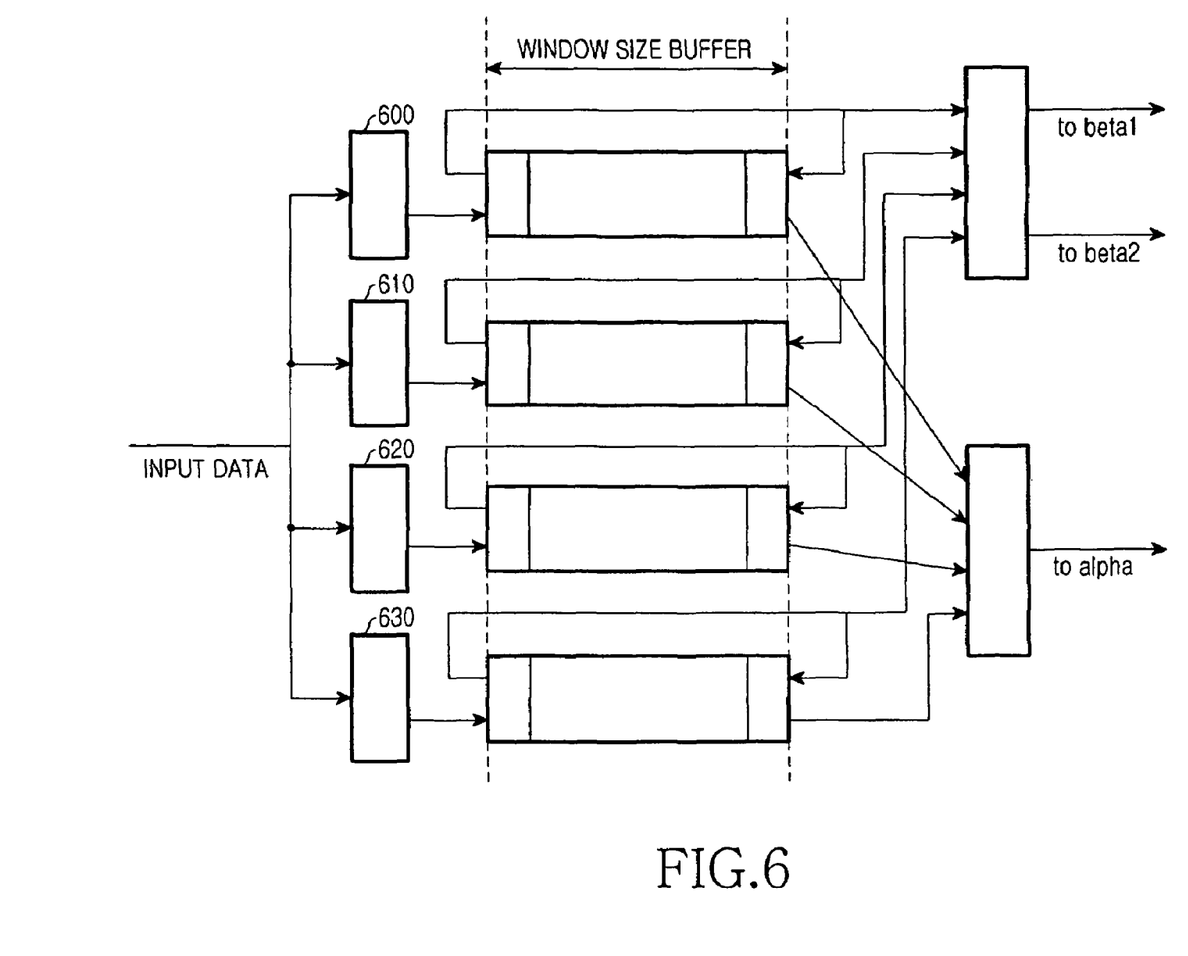
FIG. 6 is a diagram illustrating a decoding process for processing input data in a decoder using an MAP scheme according to an embodiment of the present invention.
Figure 7:
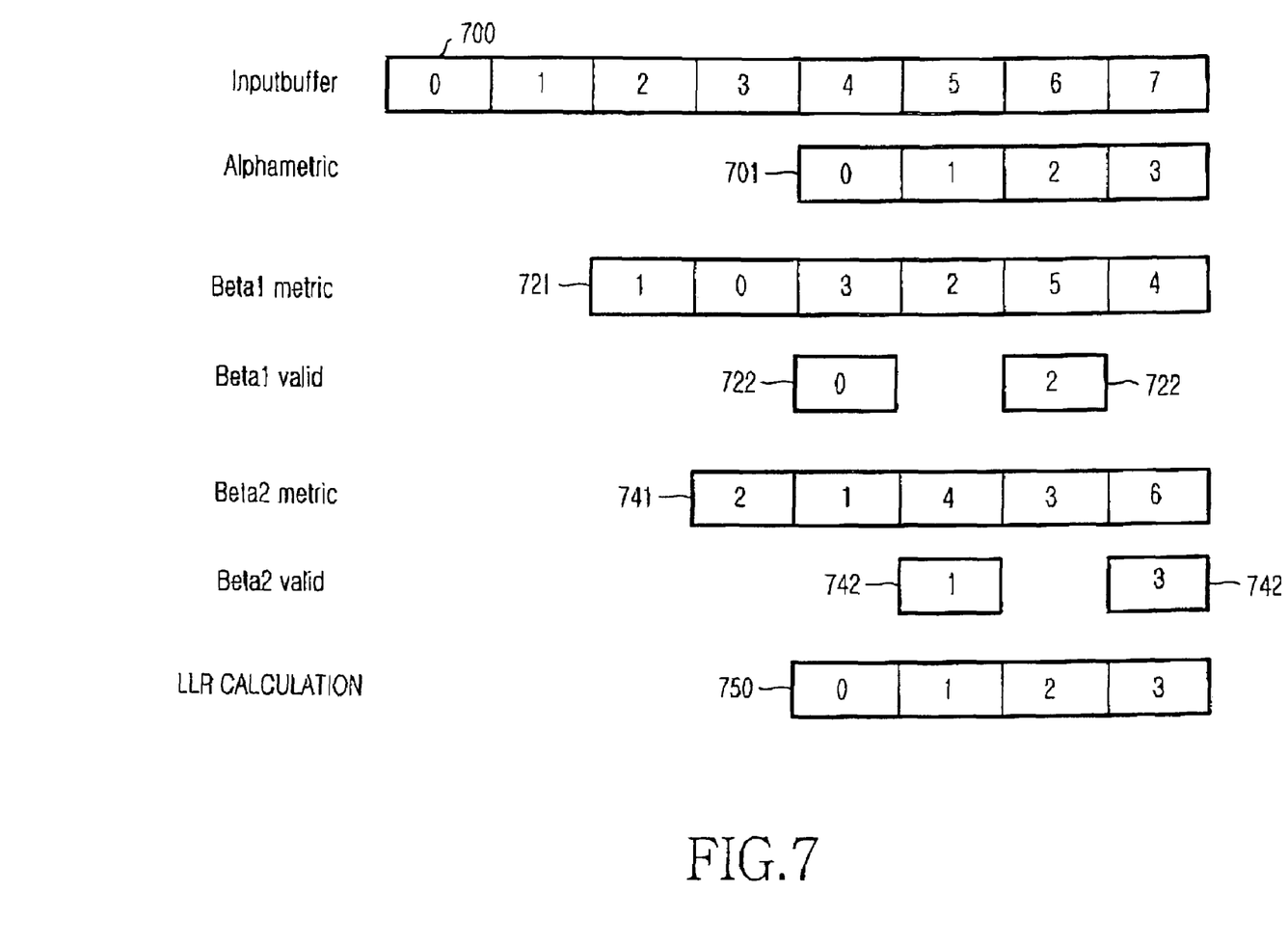
FIG. 7 is a diagram illustrating a result obtained by processing input data according to time in a decoder using an MAP scheme according to an embodiment of the present invention.

FIG. 6 is a diagram illustrating a procedure for processing input data in a decoder using an MAP scheme according to an embodiment of the present invention, and FIG. 7 is a diagram illustrating the result obtained by processing input data according to time in a decoder using an MAP scheme according to an embodiment of the present invention.

As shown in FIG. 6, in an embodiment of the present invention, an LLR is obtained by means of four memories corresponding to window size. Referring to FIGS. 6 and 7, in a metric calculation, when data is input through the input memory 510, switches are controlled to be sequentially turned on/off, so that a reading/writing operation is performed for data corresponding to a first window through a fourth window in a forward/backward direction. Herein, it may be shown that four switches 600 to 630 exist according to four windows. However, the four switches may be operated by one switch.

That is, the switch 600 is turned on and data of a single window size is stored in a first memory. Then, the switch 600 is turned off. Next, the switch 610 is turned on and data of a single window size or block is stored in a second memory. Then, the switch 610 is turned off. Then, the switch 620 is turned on and data of a single window is stored in a third memory. Then, the switch 620 is turned off. Last, the switch 630 is turned on and data of a single window is stored in a fourth memory. Then, the switch 630 is turned off. These are the operations of the switches according to the alpha metric calculation. That is, the input data is output in the forward direction in order to allow the input data to have four times the window.

In relation to the alpha metric calculation, when data is completely filled in the second memory and third data is input, the data stored in the second memory is output to the beta 1 metric block 532. That is, in the beta 1 calculation, the data for a window stored in the second memory is output as data valid for a beta 1 according to a backward calculation, and the output data is stored in the beta buffer 550. Then, the data for a window stored in the first memory is output as data valid for the beta 1, and the output data is stored in the beta buffer 550.

Further, when data is completely filled in the third memory and data for a fourth window is input, the data for a window stored in the third memory is output to the beta 2 metric block 542. Herein, the calculation is simultaneously performed in the beta 1 metric block 532 and the beta 2 metric block 542. That is, the data for a window stored in the third memory is output as data valid for a beta 2 according to a backward calculation, and the output data is stored in the beta buffer 550. Then, data for a second window is output as data valid for the beta 2, and the output data is stored in the beta buffer 550.

Herein, before a write operation is performed for the data of the beta 1 and the data of the beta 2, the data of the beta 1 is shifted and output and the data of the beta 2 is shifted and input by a FIFO scheme. That is, the alpha metric is calculated the moment the data of the beta 1 is shifted and output, thereby calculating an LLR with the data of the beta 1 again.

Further, the data of the beta 1 is shifted and input the moment the data of the beta 2 is shifted and output, thereby calculating an LLR with the data of the beta 2 and data according to the alpha metric. Further, the metric calculation as described above is performed for the last data of a frame.

Referring to FIG. 7 again, data (700) input in a sequence of (0, 1, 2, 3) and (4, 5, 6, 7) is subjected to the alpha metric calculation having four window size and is then input (701).

Herein, when data corresponding to the two window size is input (0 and 1 of 700), data corresponding to two windows is output by the beta 1 metric calculation in the backward direction (721). That is, the data is output in a sequence of (1, 0) and (3, 2) and (5, 4) through the beta 1 metric calculation process (721) and valid values 0 and 2 of the output data are outputted to a beta memory (722).

Further, when data corresponding to the three window size is input (0, 1 and 2 of 700), data of a single window size is delayed according to the beta 2 metric calculation, and data of the two window size is output in the backward direction (741). That is, the data is output in a sequence of (2, 1) and (4, 3) and 6 through the beta 2 metric calculation process (741) and valid values 1 and 3 of the output data are outputted to the beta memory (742).

Accordingly, the result value of the alpha metric calculation and the valid values obtained through the beta 1 and 2 metric calculation are compared with each other by means of the memory having a four window size, so that the LLR calculation is performed. That is, the iterative decoding is controlled by means of the LLR (750).

As described above, in embodiments of the present invention, hardware resources according to a forward metric calculation and a backward metric calculation are shared by means of one memory having a four window size. Therefore, the hardware size of a turbo decoder can be reduced.

Accordingly, the power consumption can be minimized as the hardware resources are saved.

Further, in embodiments of the present invention, a path merging of a metric calculation according to a decoding and a path according to the generation of a metric value are simplified, so that a processing time according to a decoder calculation can be reduced.

Although a preferred embodiment of the present invention has been described for illustrative purposes, those skilled in the art will appreciate that various modifications, additions and substitutions are possible, without departing from the scope and spirit of the invention as disclosed in the accompanying claims, including the full scope of equivalents thereof.

What is claimed is:

1. A method for performing iterative decoding by a decoder in a mobile communication system using a turbo code, the method comprising the steps of:
   a) performing, via a decoding device, a forward metric calculation for sequentially input data by means of one memory corresponding in size to four times a window of predetermined size;
   b) performing, via a decoding device, a first backward metric calculation for the input data when the forward metric calculation is performed for the input data by a size of three times the window in said one memory; and
   c) performing, via a decoding device, a second backward metric calculation for the input data when the forward metric calculation is performed for the input data by four times the window size in said one memory.

2. The method in claim 1, further comprising a step of performing a forward metric calculation or a backward metric calculation through said one memory.

3. The method in claim 1, wherein step a) further comprises a step of performing a forward alpha metric calculation for the input data so that the input data has a four window size and performing iterative decoding.

4. The method in claim 1, wherein step b) further comprises a step of performing a first backward beta metric calculation for data corresponding in size to two windows, outputting valid data, and performing iterative decoding, when the forward metric calculation is performed for the input data of three times the window size.

5. The method in claim 1, wherein step c) further comprises a step of performing a second backward beta metric calculation for data of three times the window size, outputting valid data, and performing iterative decoding, when the forward metric calculation is performed for the input data having four times the window size.

6. The method in claim 1, further comprises a step d) of selectively outputting a first backward beta metric calculation value and a second backward beta metric calculation value, comparing the first backward beta metric calculation value and the second backward beta metric calculation value with an alpha metric calculation value, and controlling iterative decoding.

7. A decoding apparatus for performing iterative decoding in a mobile communication system using a turbo code, the decoding apparatus comprising:
   one memory for outputting input data having four times a window of predetermined size in the forward direction or a backward direction;
   an alpha metric block for performing a forward metric calculation for sequentially inputting data so that the data has a size of four times the window;
   a first metric block for performing a first backward metric calculation for the input data, when a forward calculation is performed for the input data having a size of three times the window; and
   a second metric block for performing a second backward metric calculation for the input data, when a forward calculation is performed for the input data having four times the size of the window.

8. The decoding apparatus in claim 7, wherein said one memory is a memory for performing a forward metric calculation or a backward metric calculation.

9. The decoding apparatus in claim 7, wherein the metric block is a block for performing a forward alpha metric calculation for the input data so that the input data have a size of four times the window, and for performing iterative decoding.

10. The decoding apparatus in claim 7, wherein the first metric block is a block for performing a first backward beta metric calculation for data of two window sizes, outputting valid data, and performing iterative decoding, when the forward metric calculation is performed for the input data having a size of three times the window size.

11. The decoding apparatus in claim 7, wherein the second metric block is a block for performing a second backward beta metric calculation for data having a size three times the window size, outputting valid data, and performing iterative decoding, when the forward metric calculation is performed for the input data having a size that is four times the window size.

12. The decoding apparatus in claim 7, further comprising a beta buffer for alternatively storing valid data of the first metric block and valid data of the second metric block.

13. The decoding apparatus in claim 7, further comprising a Log-Likelihood Ratio (LLR) block for comparing the calculation value of the alpha metric block, valid data of the first metric block, and valid data of the second metric block with one another, and controlling iterative decoding.

* * * * *

UNITED STATES PATENT AND TRADEMARK OFFICE
CERTIFICATE OF CORRECTION

| | | |
|---|---|---|
| PATENT NO. | : 7,584,407 B2 | Page 1 of 1 |
| APPLICATION NO. | : 11/038122 | |
| DATED | : September 1, 2009 | |
| INVENTOR(S) | : Seok-Chan Kim | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1127 days.

Signed and Sealed this

Fourteenth Day of September, 2010

David J. Kappos
*Director of the United States Patent and Trademark Office*